United States Patent

Dick

[11] Patent Number: 5,943,612
[45] Date of Patent: Aug. 24, 1999

[54] RADIO RECEIVERS

[75] Inventor: Burkhard Dick, Hamburg, Germany

[73] Assignee: U.S. Philips Corporation, New York, N.Y.

[21] Appl. No.: 08/823,573

[22] Filed: Mar. 25, 1997

[30] Foreign Application Priority Data

Mar. 27, 1996 [EP] European Pat. Off. .............. 96302095

[51] Int. Cl.⁶ ...................................................... H04B 1/18

[52] U.S. Cl. .................................... 455/241.1; 455/244.1; 455/247.1

[58] Field of Search ............................. 455/234.1, 234.2, 455/240.1, 241.1, 244.1, 247.1, 250.1, 251.1, 254

[56] References Cited

U.S. PATENT DOCUMENTS

| | | | |
|---|---|---|---|
| 5,369,792 | 11/1994 | Matsumoto et al. | 455/245.1 |
| 5,513,387 | 4/1996 | Saito et al. | 455/234.1 |
| 5,758,271 | 5/1998 | Rich et al. | 455/234.1 |

*Primary Examiner*—Thanh Cong Le
*Attorney, Agent, or Firm*—Jack D. Slobod

[57] ABSTRACT

A radio receiver comprising signal receiving means(10), means(12) for adjusting the amplitude of a signal received by said signal receiving means, a signal transmission system (32) coupled to said means for adjusting the signal amplitude, an agc feedback loop(38,42,40) coupled between an output of the signal transmission system and a control input of the signal amplitude adjusting means, the agc feedback loop comprising means for producing a multiple switched agc signal.

20 Claims, 5 Drawing Sheets

RADIO RECEIVERS

BACKGROUND OF THE INVENTION

1. Field of the Invention

The present invention relates to a radio receiver and particularly to an automatic gain control ( agc ) system.

For the sake of convenience the term "radio receiver" is also intended to cover the receiver sections of transceivers.

2. Description of the Related Art

In order to operate in the present day increasingly crowded radio frequency environment in which wanted and unwanted adjacent radio channels frequently have strong signals, it has become a necessary for radio receivers, especially those with low or zero intermediate frequencies, to have agc systems which attenuate the received signals and/or vary the gain of an input rf amplifier. Analog agc systems are known in which corrections are done continuously but in order to provide stability and suppress interference such systems have a relatively long time constant which is a disadvantage for receivers operating on a time division basis where for reasons of battery conservation the receiver is switched-off for those time periods when it is known that a signal will not be sent to that receiver. An example of such a receiver is a paging receiver operating in accordance with the CCIR Radiopaging Code No.1 (otherwise known as POCSAG) in which once the receiver has achieved bit synchronization, it is powered up for one code word period in every batch of 17 code words in order to detect the sync. code word after which it is powered down. The remainder of the batch comprises 8 frames, each frame comprising 2 code words. A pager is allocated to a predetermined frame in a batch. Just prior to the occurrence of its frame the receiver is powered up in order to be able to receive any address messages transmitted in that frame. Following expiration of the predetermined frame, the receiver is powered down until just prior to the occurrence of a sync. code word in the next following batch. The cycle of powering -up and -down continues until transmissions have ceased.

An advantage of using a zero IF architecture for making radio receivers, especially for use in compact equipment such as pagers, is that they can be fabricated as integrated circuits. However one of the biggest problems for applying agc to zero IF receivers is that of self reception, that is the reception of the receiver's own local oscillator (LO) due to leakage or of any unmodulated on-channel signal, which produces an unwanted dc offset voltage at the outputs of the mixers. Variations in the strength of the input signal leads to changes in gain of the input amplifier which causes the dc offset voltage to change which leads to the generation of a transient. The transient is detected by a level detector of the agc circuit as a rising signal which can cause instability. Changes in the gain when a weaker signal is being received leads to an amplification of the self received LO signal which causes a change in the unwanted dc offset voltage. Merely changing the orientation of the receiver's antenna relative to its local environment can lead to instability.

FIGS. 1 and 2 of the accompanying drawings illustrate respectively a radio receiver having a single switched agc loop and the associated transfer function. For convenience of illustration, the radio receiver is a superheat receiver which comprises an antenna 10 which is coupled to a variable gain rf amplifier 12 which has an agc signal input 14. An output of the rf amplifier 12 is connected to a first input of a mixer 16. A local oscillator 18 is coupled to a second input of the mixer 16. A post-mixer amplifier 20 is coupled to an output of the mixer 16. A filter 22, for example a low pass filter, selects the desired band of signals from the products of the mixing operation and supplies them to an output terminal 24. An agc circuit has an input coupled to the output of the filter 22, which input is coupled to a level detector circuit 26 which produces a voltage indicative of the level of the voltage at the output of the filter 22. A delay stage 28 having a time constant r is coupled between an output of the level detector 26 and a non-inverting input of a comparator 30.

A reference voltage $V_{ref}$ is applied to the inverting input of the comparator 30.

An output of the comparator 30 is applied to the gain control input 14 of the rf amplifier 12. The comparator 30 behaves as a switch with hysteresis.

Referring now to FIG. 2, if the signal from the delay stage is increasing from a low value which is outside the control range, the agc circuit behaves with maximum input gain. However, when the input voltage reaches a predetermined level Vx1, corresponding to an output voltage of $V_{out1}$, a fixed level of attenuation is switched into the circuit causing the output voltage to drop to a value Vy1. If the input voltage continues to increase, the output continues to increase.

Conversely when the input voltage decreases to another predetermined level Vx2, the fixed level of attenuation is switched out of the circuit causing the output voltage to rise to a value of Vy2.

In operation it is only during the switching process that the loop is closed, otherwise the loop is effectively open. As a result the time constant T of the delay circuit 28 can be much smaller and also an improved stability under self-reception is improved significantly. In spite of these improvements, a single switched agc circuit has only a limited range of controlling the input voltage level, namely between $V_{in2}$ and $V_{in1}$ which in turn is dependent on the limits of the output namely $V_{out2}$ to $V_{out1}$, where $V_{out2}$ is limited by receiver sensitivity considerations and $V_{out1}$ is determined by maximum permitted input level having regard second and third order intermodulation products IP2 and IP3.

OBJECTS AND SUMMARY OF THE INVENTION

An object of the present invention is to extend the range of control of a switched agc circuit.

According to one aspect of the present invention there is provided a radio receiver comprising signal receiving means, means for adjusting the amplitude of a signal received by said signal receiving means, a signal transmission system coupled to said means for adjusting the signal amplitude, an agc feedback loop coupled between an output of the signal transmission system and a control input of the signal amplitude adjusting means, the agc feedback loop comprising means for producing a multiple switched agc signal.

By means of the present invention the control range of the agc loop can be extended significantly.

The present invention also provides a radio receiver comprising signal receiving means, means for adjusting the amplitude of a signal received by said signal receiving means, means for frequency down converting the signal at an output of the amplitude adjusting means, means for selecting a wanted signal from the output of the frequency down converting means and providing an output signal, an agc feedback loop coupled between an output of the wanted signal selecting means and a control input of the signal amplitude adjusting means, the agc loop comprising level detecting means and means for producing a multiple switched agc signal.

The means for producing multiple switched agc signals may comprise a plurality of n switches, where n is an integer having a value of at least 2, arranged in tandem, each switch having a first input for a reference voltage signal, a second input for an input signal, a fast hysteresis output, a slow hysteresis output and a signal output, a reference voltage source coupled to each first input, n first fast hysteresis voltage controlled voltage sources (hereinafter called fast voltage sources), each of said n first fast voltage sources being coupled in series opposition with each of the n reference voltage sources, (n−1) second fast voltage sources being connected in series with the first fast voltage sources of the second to n switches, and so on with one nth fast voltage source connected in series with the first to (n−1)th fast voltage sources of the nth switch, each of said first to n fast voltage sources being controlled by the fast hysteresis output of its correspondingly numbered stage, n slow hysteresis voltage controlled voltage sources (hereinafter called slow voltage sources) connected in series between a signal input and an input to a time delay circuit, an output of the delay circuit being coupled in parallel to the second inputs of said n switches, a control input of each of the slow voltage sources being coupled to a respective one of the slow hysteresis outputs.

According to a second aspect of the present invention there is provided a paging receiver having a receiving stage, a decoding stage coupled to an output of the receiver stage and means for indicating the receipt of a paging message, wherein the receiving stage comprises signal receiving means, means for adjusting the amplitude of a signal received by said signal receiving means, a signal transmission system coupled to said means for adjusting the signal amplitude, an agc feedback loop coupled between an output of the signal transmission system and a control input of the signal amplitude adjusting means, the agc feedback loop comprising means for producing multiple switched agc signals.

BRIEF DESCRIPTION OF THE DRAWINGS

The present invention will now be described, by way of example, with reference to the accompanying drawings, wherein.

In the drawings the same reference numerals have been used to indicate corresponding features.

DETAILED DESCRIPTION OF THE PREFERRED EMBODIMENT

Figure 3:
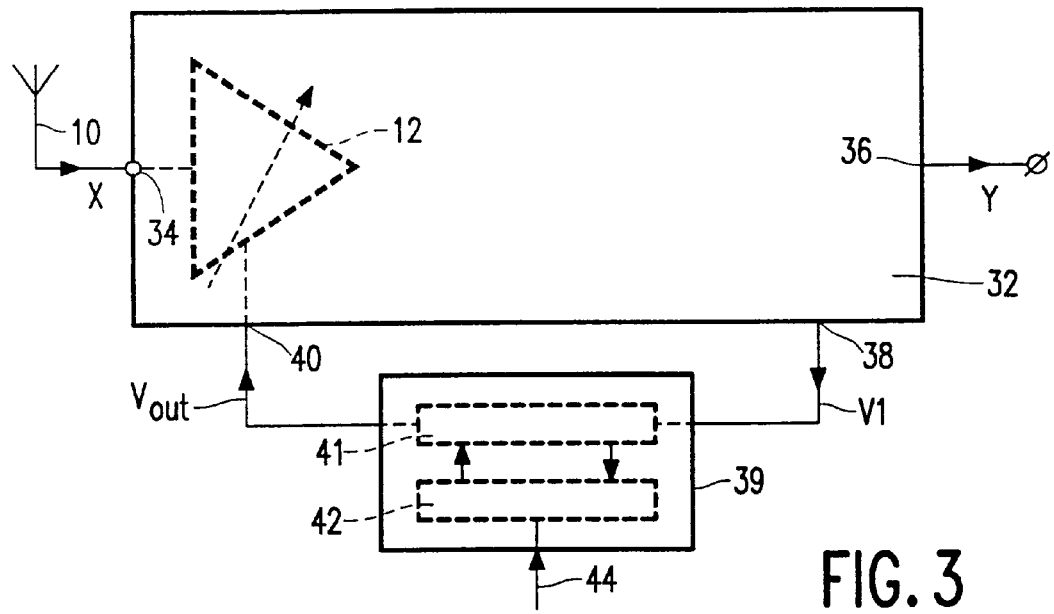
FIG. 3 is a block schematic diagram of an embodiment of the present invention.
Figure 8:
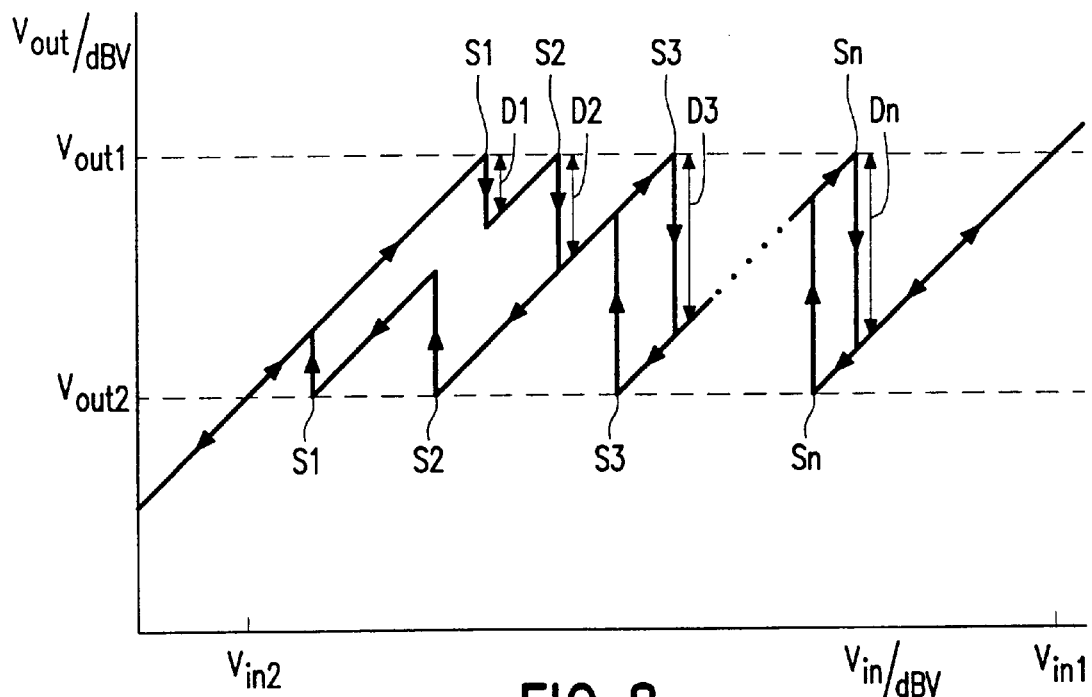
FIG. 8 illustrates an example of a transfer function obtainable with the multiple switch agc control loop.

Referring to FIG. 3 of the accompanying drawings, a signal receiving system comprising a suitable receiver 32, such as a superheterodyne receiver or zero IF receiver, having an input 34 for a signal having an input magnitude X and an output 36 for a signal having an output magnitude Y. A closed agc loop is coupled between an output 38 of the receiver providing an indication V1 of the signal magnitude and an input 40 for an agc voltage referenced $V_{out}$. A multiple switch and clamping circuit 39 is coupled between the output 38 and input 40. The circuit 39 comprises a multiple switch 41 and a clamping circuit 42. The clamping circuit 42 has an input 44 for a clamping circuit (on/off) control signal. The purpose of the clamping circuit 42 is to clamp the agc voltage at a predetermined value during warm-up of the receiver to avoid the agc circuit trying to track the changes which occur as the receiver warms-up. In the case of the receiver being a paging receiver operating in accordance with a battery conservation protocol, such as exists in POCSAG, in which the receiver stage proper is repeatedly energized and de-energized, the signal at the input 44 is derived from the decoder 82 or microcontroller 84 to be described with reference to FIG. 9. By having a multiple switch 39 it is possible to extend the agc control range somewhat as shown in FIG. 8 which will be discussed later. In operation the circuit 39 acts on the transmission system 32 to counter a decreasing or increasing trend in the signal V1 and achieve a quiescent state.

Figure 4:
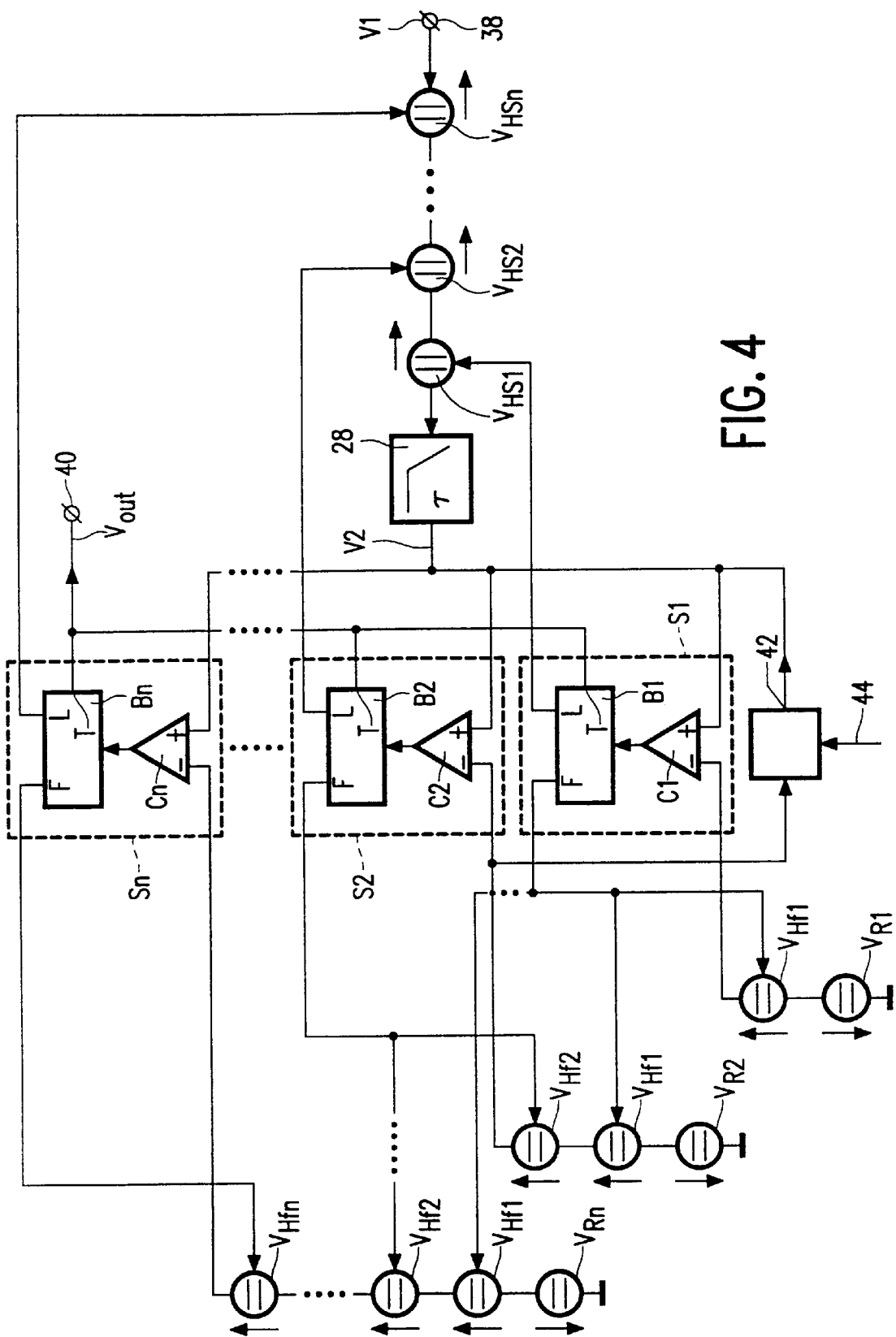
FIG. 4 is a block schematic diagram of an embodiment of a multiple switch and clamping circuit.

FIG. 4 illustrates an embodiment of the multiple switch 41 and the clamping circuit 42. The clamping circuit 42 is shown in block schematic form and will be described in greater detail with reference to FIGS. 6 and 7.

The illustrated circuit may be summarized as comprising a plurality of n switches S1 to Sn, where n is an integer having a value of at least 2, arranged in tandem. Each switch has a first, inverting input for a reference voltage signal, a second, non-inverting input for an input signal, a fast hysteresis output F, a slow hysteresis output L and a signal output T. The outputs T are connected in parallel to an output terminal 40 on which the voltage $V_{out}$ is present. By such an arrangement the output voltage $V_{out}$ is the sum of the signal output voltages $V_{T1}$ to $V_{Tn}$ of the switches S1 to Sn, that is $V_{out} = V_{T1} + V_{T2} + \ldots + V_{Tn}$ or some other combination of the signal output voltages $V_T$, for example $V_{out11} = V_{T1} + V_{T5}$ or $V_{out22} = V_{T3} + V_{Tx} + V_{T(n-1)}$.

A reference voltage source $V_{R1}$ to $V_{Rn}$ is coupled to each first input. n first fast hysteresis voltage controlled voltage sources (hereinafter called fast voltage sources) $V_{Hf1}$ to $V_{Hfn}$ are provided. Each of said n first fast voltage sources $H_{Hf1}$ is coupled in series opposition with each of the n reference voltage sources $V_{R1}$ to $V_{Rn}$. (n−1) second fast voltage sources $V_{Hf2}$ are connected in series with the first fast voltage sources $V_{Hf1}$ of the second to n switches S2 to Sn, and so on with one nth fast voltage source $V_{Hfn}$ being connected in series with the first to (n−1)th fast voltage sources $V_{Hf1}$ to $V_{Hf(n-1)}$ of the nth switch Sn. Each of said first to n fast voltage sources $V_{Hf1}$ to $V_{Hfn}$ is controlled by the fast hysteresis output F of its correspondingly numbered stage. n slow hysteresis voltage controlled voltage sources (hereinafter called slow voltage sources) $V_{Hs1}$ to $V_{Hsn}$ are connected in series between the signal input 38 and an input to a time delay circuit 28 having a delay T. An output of the delay circuit 28 is coupled in parallel to the second inputs of said n switches S1 to Sn. A control input of each of the slow voltage sources $V_{HS1}$ to $V_{Hsn}$ is coupled to a respective one of the slow hysteresis outputs L.

Each of the switches S1 to Sn comprises a comparator C1 to Cn having first, inverting and second, non-inverting inputs for a reference voltage and for a delayed version, V2, of the input signal V1, respectively, and a block B1 to Bn for producing different outputs F, L and T.

The fast voltage source(s) $V_{Hf1}$ to $V_{Hfn}$ are connected in series opposition to the respective reference voltage source $V_{R1}$ to $V_{Rn}$. The effect of this is that when activated the voltage of the fast voltage source is subtracted from the voltage of its associated reference voltage source substantially instantaneously.

Another point to note is that the F output of a switch, say switch S1, controls all the first fast voltage sources $V_{Hf1}$ which are connected in series opposition to the respective reference voltage sources $V_{R1}$ to $V_{Rn}$. Thus, for example, when the switch S1 is active, all the reference voltages $V_{R1}$ to $V_{Rn}$ are reduced by $V_{Hf1}$, when the switch S2 is active all the reference voltages $V_{R2}$ to $V_{Rn}$ are additionally reduced by $V_{Hf2}$, and so on until when the switch Sn is active, the reference voltage $V_{Rn}$ is additionally reduced by $V_{Hfn}$.

In the embodiment shown in FIG. 4 the clamping circuit 42 is connected between the first, inverting input of the comparator C2 of the switch S2 and the line coupled to the output of the delay circuit 28. Thus when the clamping circuit 42 is active during warm-up, the agc voltage is clamped at the voltage on the first, inverting input of the comparator C2. However the input of the clamping circuit 42 may be connected to the first input of any one of the comparators C1 to Cn.

In a general case with each switch Sx (FIG. 5B), when the comparator Cx produces an output, the $V_{Hfx}$ fast voltage source is activated rapidly to reduce the reference voltage at the first input of the comparator Cx, the voltage at the output T undergoes a steplike change which alters the gain of the rf amplifier 12 (FIG. 3) and/or a PIN diode attenuator (not shown). However the output L of the block Bx of the switch Sx has activated slow voltage source $V_{Hsx}$ which causes the voltage V2 at the output of the delay circuit 28 to rise gradually. After a time period corresponding to T, the voltage V2 at the output of the delay stage 28 has reached the reference value of the next higher stage S(x+1) activates fast voltage source $V_{Hf(x+1)}$, which substantially instantaneously decreases further the voltage at the first (or reference) input of C(x+1) and switches on $V_{Hs(x+1)}$ and the cycle repeats up to the final switching stage Sn being activated.

In the converse situation the magnitude of the input signal V1 has to be decreased relative to $V_{R1}$ until the voltage at the relevant comparator input (non-inverting to inverting) is zero or less than zero (that is negative), the comparator output changes causing its associated block to switch from "on" to "off". As a result the output T produces an output which is applied by way of the output terminal 40 (FIG. 4) to produce a step-like increase in the gain of the rf amplifier 12 and/or reduction in the applied attenuation. The F output switches off its associated $V_{Hfx}$ fast voltage sources and the L output switches off its associated slow voltage source $V_{Hsx}$.

The voltage at the inverting input of the next lower switch S(x−1) in the chain is immediately increased by the equivalent of $V_{Hfx}$, because it is no longer being subtracted from the corresponding $V_{R(x−1)}$. Once the delayed voltage V2 diminishes to below the voltage on the inverting input, the cycle repeats again.

In the case of the lowest switch S1, if the input signal V1 is less than or equal to $V_{R1}-V_{Hf1}-V_{Hs1}$ then no further gain and/or attenuation changes are made.

Although the description above refers to a sequential operation of the switches S1 to Sn or Sn to S1, this need not be the case because the operation of the switches is dependent on changes in the input signal V1 which may vary in direction. However by effecting step-like changes in gain and/or attenuation, these can be effected rapidly in a way which does not cause instability leading to oscillation in the agc circuit.

FIG. 8 illustrates the upper (Vin1) and lower (Vin2) input voltage control range and the upper ($V_{out1}$) and lower ($V_{out2}$) limits which when reached by the saw toothed waveform cause a step-like increase or decrease in attenuation. The delay in a switch being operated in an increasing direction as opposed to a decreasing direction is due to the time delay T. The size of the damping factors D1 to Dn is dependent on the size of the input attenuation.

In operation:

Switch $Sx$ is switched on when $V2 > V_{Rx} - V_{hf1} \ldots -V_{Hf(x-1)}$

Switch $Sx$ is switched-off when $V2 < V_{Rx} - V_{Hf1} \ldots -V_{Hfx}$

As a generality the following relationship applies between the reference voltage sources and the fast voltage controlled voltage sources.

$$V_{Rn}-V_{Hf1}\ldots -V_{Hfn} > V_{R(n-1)}-V_{Hf1}\ldots -V_{Hf(n-1)}$$

This expression describes that for an increasing input signal V1, switch S(n−1) always is activated before switch Sn and for a decreasing level of V1, Sn is switched off before switch S (n−1).

The input signal V1 can be either a varying DC voltage or a rectified AC-voltage.

In one embodiment of the present invention the reference voltage sources may be dimensioned to have the following relationship:

$$V_{R1} < V_{R2} < \ldots < V_{Rn}$$

additionally the difference ($V_{Hys}$) in voltage between successive pairs of reference voltage sources is as follows:

$$V_{Hys1} < V_{R2}-V_{R1}; \ldots V_{Hys(n-1)} < V_{Rn}-V_{R(n-1)}$$

$$V_{Hys1}=V_{Hf1}+V_{Hs1}; \ldots H_{Hysn}=V_{Hfn}+V_{Hsn}$$

$$V_{hys1}=V_{Hf1}+V_{Hs1}; \ldots H_{Hysn}=V_{Hfn}+V_{hsn}$$

In order to facilitate understanding of the operation of an embodiment of the present invention, the following practical example will be given:

The differences between successive pairs of reference voltages are made equal so that:

$$V_{R2}-V_{R1}=V_{R3}-V_{R2}=\ldots =V_{Rn}-V_{R(n-1)}$$

Also:

$$V_{Hys1}=V_{R2}-V_{R1}; V_{Hys2}=V_{R3}-V_{R2}; \ldots V_{Hys(n-1)}=V_{Rn}-V_{R(n-1)}$$

thereby making $V_{Hys1}=V_{Hys2}=\ldots =V_{Hysn}$ and:

$$V_{Hf1}=V_{Hs1}=V_{Hf2}=V_{Hs2}\ldots V_{Hfn}=V_{Hsn}$$

Initially the input signal V1 on terminal 38 (FIG. 4) may be sufficiently small, that the switches S1, S2 ... Sn are inactive. As a consequence all the fast and slow voltage controlled voltage sources $V_{Hf1} \ldots V_{Hfn}$ and $V_{Hs1} \ldots V_{Hsn}$ are off so that their output voltages are zero. If now the input signal increases to an amplitude $V1=V_{R1}$, the output of the comparator C1 goes high turning on block B1 so that outputs F, L and T go high. As a result voltage sources $V_{Hf1}$ and $V_{Hs1}$ are rendered active and $V_{out}$ on terminal 40 goes to $V_{out1}$.

The fast voltage $V_{Hf1}$ is subtracted substantially instantaneously from $V_{R1}$ (and also from $V_{R2}$ to $V_{Rn}$) so that the output of comparator C1 remains high irrespective if there is a momentary decrease in input signal V1. The slow voltage $V_{Hs1}$ is applied to the delay circuit 28, the output voltage V2 of which slowly changes. Assuming that V1 remains equal to $V_{R1}$, then after time delay T, V2 reaches $V_{R1}+V_{Hs1}$ which corresponds to the voltage on the inverting input of the comparator C2 of the switch S2 because:

$$V_{R2}-H_{Hf1}=V_{Hs1}+V_{R1}-V_{Hf1}=V_{R1}+V_{Hs1}.$$

As a result the switch S2 becomes active causing outputs F, L and T of the block B2 to go high. The reference voltages, that is the voltages at the first, inverting inputs, of the switches S2 to Sn are abruptly changed by $-V_{Hf2}$. Slow voltage source $V_{Hs2}$ is also activated. Providing that the input signal V1 continues to remain at a magnitude of $V_{R1}$, V2 will after a time delay T reach a value of $V_{R1}+V_{Hs1}+V_{Hs2}$ which in this particular example corresponds to the actual reference voltage $(V_{R3}-V_{Hf1}-V_{Hf2})$ on the inverting input of the comparator C3 of switch S3. As a result, the switch S3 becomes active and the outputs F, L and T of the block B3 go high. The sequence of operations described progresses switch by switch up to the switch Sn, provided that V1 remains equal to or greater than $V_{R1}$.

In the converse situation, assuming that switches S1 to Sn are all activated and the magnitude of the input voltage drops to say $V_{R1}-V_{Hys1}$, then the switches are deactivated sequentially from Sn to S1 provided V1 remains at or decreases from $V_{R1}-V_{Hys1}$.

If one considers a general case of a switch Sx being active and the value of V1 changing to $V_{R1}-\Delta V$ ($\Delta V<V_{Hysx}$) by changing the function of the transmission system (because of $V_{outx}$) and the magnitude of the input X to the transmission system 32 (FIG. 3). The change in the magnitude of V1 in response to a change in the magnitude X is delayed by the time delay of the transmission system 32 which in turn affects the response of the switch Sx. At the input of the time delay stage 28 is a signal voltage comprising $+V_{Hsx}$ and the delayed $-\Delta V$. By choosing an appropriate time constant T, the resulting pulse is sufficiently deformed by the time delay stage 28 that its amplitude does not reach the value $V_{R1}+V_{Hs1} \ldots +V_{Hsx}$, which corresponds to the reference voltage of the switch S(x+1) with the result that the switch S(x+1) remains inactive. As the voltage V2 decays to a value of $V_{R1}+V_{Hf1}+ \ldots +V_{Hfm}-\Delta V$ (where $\Delta V<V_{Hysx}$), the switch Sx remains in the on state. The illustrated agc circuit is effectively immune from the effect of transients.

In the opposite situation of the switch Sx being de-activated, then the switch S(x-1) remains active in spite of the input voltage changing to $$V1=V_{R1}-V_{Hys1}+\Delta V \text{(where } \Delta V<V_{Hysx}).$$

Figures 5A, 5B:
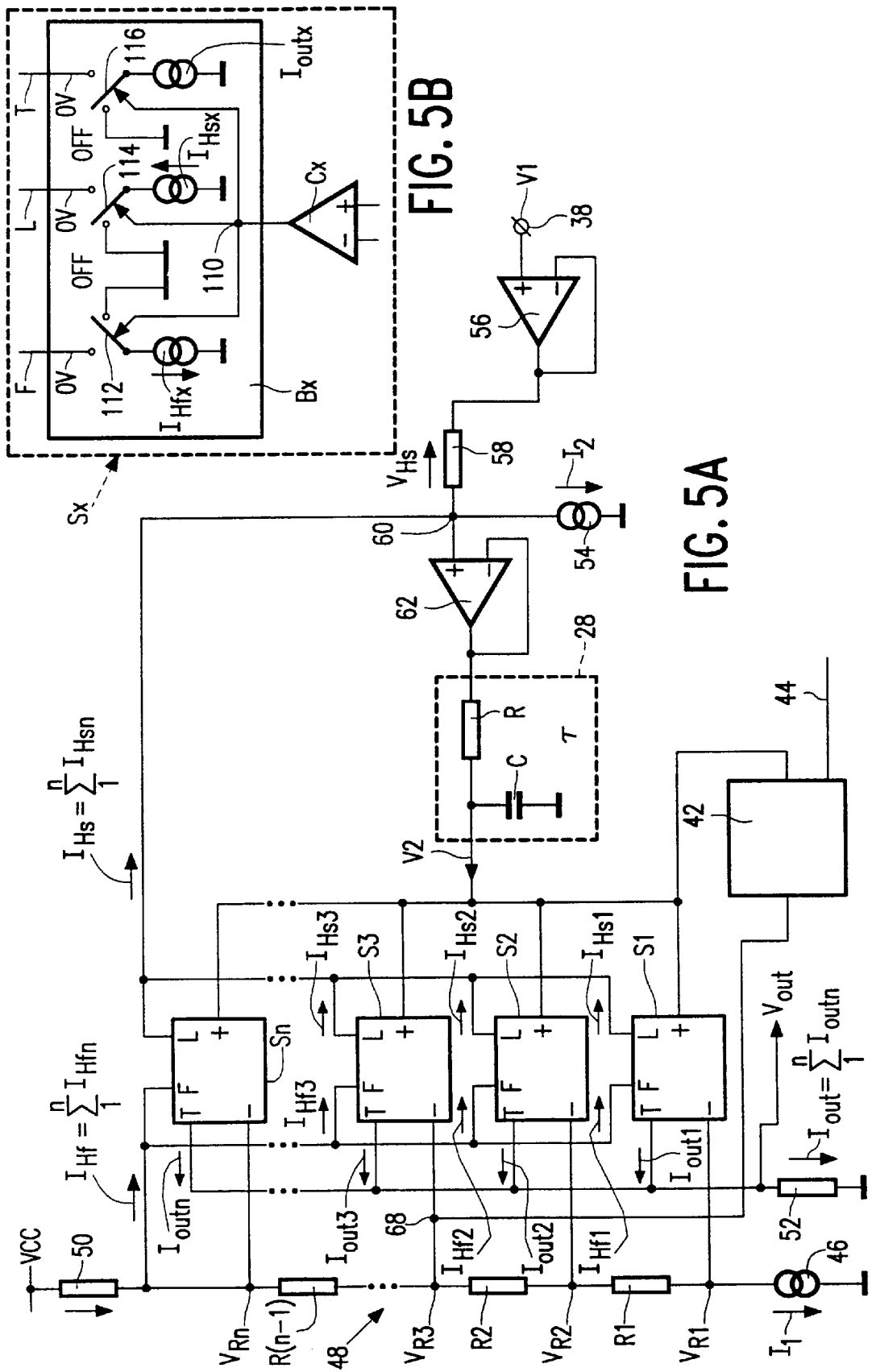
FIG. 5A is a block schematic diagram of another embodiment of a multiple switch and clamping circuit.
FIG. 5B is a block schematic diagram of one of the switches used in the circuit shown in FIG. 5A.

FIG. 5A illustrates another embodiment of the present invention in which the output signals from the switches S1, S2 ... Sn are DC-currents. The reference voltages $V_{R1} \ldots V_{Rn}$ are derived from a resistive potential divider chain 48 coupled to a constant current source 46 having a current I1. The potential divider chain comprises series connected resistors R1, R2, R(n-1) and 50. A fast hysteresis current $I_{Hf}$, where $$I_{Hf} = \sum_1^n I_{Hfn}$$

is derived from the potential divider chain 48 and is converted into a corresponding voltage by a resistor 50. The respective fast hysteresis currents $I_{Hf1} \ldots I_{Hfn}$ are applied to the F outputs of the switches S1 to Sn.

Output currents $I_{out1} \ldots I_{outn}$ are derived from the T outputs of the switches S1 to Sn and the total current $$I_{out} = \sum_1^n I_{outn}$$

is applied to a series resistor 52 to derive an output voltage $V_{out}$.

The slow hysteresis currents $I_{Hs1}$ to $I_{Hsn}$ are derived from a current source 54 which is connected in parallel to the L outputs of the switches S1 to Sn. The total slow hysteresis current $$I_{Hs} = \sum_1^n I_{Hsn}$$

The input voltage V1 is applied to the non-inverting input of an op-amp 56 whose output is fed back to its non-inverting input. A resistor 58 connected between a junction 60 with the current source 54 and the output of the op-amp 56 converts the slow hysteresis current $I_{Hs}$ to a slow hysteresis voltage $V_{Hs}$. The junction 60 is also connected to a non-inverting input of another op-amp 62 whose output is connected back to its inverting input and also to the delay circuit 28 implemented as a low pass filter having an integrating capacitor C. The output of the delay circuit 28 which provides the voltage V2 is coupled in parallel to the non-inverting inputs of the switches S1 to Sn. The op-amps 56, 62 are provided respectively to decouple the input voltage V1 from the slow hysteresis voltage $V_{Hs}$ and to decouple the delay circuit 28 from the junction 60.

Referring to FIG. 5B which shows the general construction of one of the switches Sx. The comparator Cx has inverting and non-inverting inputs connected as shown in FIG. 5A. The output of the comparator Cx is coupled to an input 110 of a switching block Bx. Three dc current sources $I_{Hfx}$, $I_{Hsx}$ and $I_{outx}$ are provided. First, second and third switches 112, 114 and 116 controlled by the signal at the input 110, connect the current sources $I_{Hfx}$, $I_{Hsx}$ and $I^{outx}$ either to their respective outputs F, L and T when the switches are on or to ground when the switches are off.

In the operation of the circuits shown in FIGS. 5A and 5B, if the fast and slow hysteresis currents are zero, then $V_{R2}=V_{R1}+I1.R1$, $V_{R3}=V_{R2}+I1.R2$ and so on. If now the switch S1 is on, the current source $I_{Hf1}$ is activated and generates a voltage drop at the resistor 50. As a result the reference voltages $V_{R1}$ to $V_{Rn}$ are changed by $-V_{Hf1}$ to become $V_{R1}-V_{Hf1}$ to $V_{Rn}-V_{Hf1}$. If the switch S2 is switched on, the current source $I_{Hf2}$ is activated and as a consequence the reference voltages are changed by $-V_{Hf2}$ so that for example $V_{R1}-V_{Hf1}$ becomes $V_{R1}-V_{Hf1}-V_{Hf2}$, and so on.

At the signal input side, the current I2 of the source 54 is a fixed DC current for level shifting. By activating $I_{Hs1}$ to $I_{Hsn}$, the voltage $V_{Hs}$ is changed from $-I2$. R58 (where R58 is the resistance of the resistor 58) to $(-I2+I_{Hs1})$. R58 ... $(-I2+I_{Hs1}+ \ldots +I_{Hsn})$.R58.

The circuits otherwise operate as described with reference to FIG. 4.

The clamping circuit 42 is connected between the reference voltage input of the switch S3 and the line coupled to the output of the delay circuit 28.

By the clamping circuit 42 in the embodiments of FIGS. 4 and 5A having an input 68 connected to a point in the switching chain above the switch S1 and being active during powering-up and -down of the receiver, the effects of any transients which are generated as a result of switching-on or -off the receiver, which will occur frequently when operating in accordance with a time division protocol such as a digital paging protocol, for example the CCIR Radiopaging Code No.1 (alternatively known as POCSAG), are suppressed and have no effect on the input gain setting of the rf amplifier and/or input attenuator. Once the receiver has stabilised, the clamping circuit is de-activated.

Figure 6:
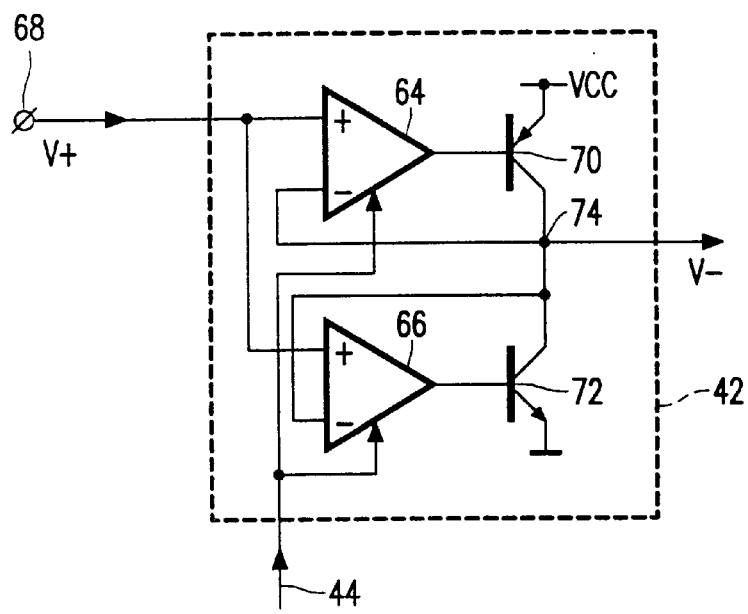
FIG. 6 is a block schematic diagram of an embodiment of the clamping circuit.

FIG. 6 illustrates an embodiment of the clamping circuit 42 which comprises two operational amplifiers 64, 66 connected in parallel and providing a current output. An input terminal 68 is coupled in parallel to the non-inverting inputs of the op-amps 64, 66 which provide a high ohmic input. Outputs of the op-amps 64, 66 are respectively connected to the base electrodes of PNP transistor 70 and NPN transistor 72 whose emitter-collector paths are connected in series with the collectors being connected to a junction 74. The junction 74 is connected to the inverting inputs of the op-amps 64, 66. The clamping circuit control signal input 44 is connected to control inputs of the op-amps 64, 66.

Figure 7:
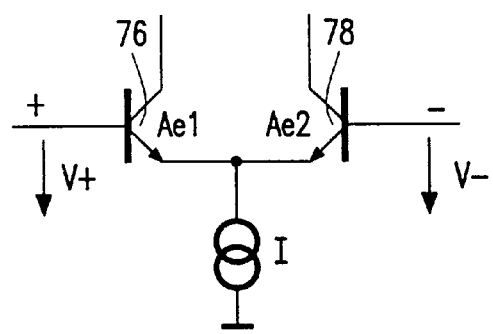
FIG. 7 is a schematic circuit diagram of the input stage of the op-amps shown in FIG. 6.

FIG. 7 shows the input stage of each of the op-amps 64, 66, which stage comprises a differential amplifier formed by emitter coupled NPN transistors 76, 78, who base electrodes are connected respectively to the non-inverting and inverting inputs of the op-amp. The emitter area Ae1 of the transistor 76 is greater than that Ae2 of the transistor 78. When the output currents of the op-amps 64, 66 are in-phase, one or other, but not both, of the transistors 70, 72 is rendered conductive. For an increasing voltage V+ on the input 68, the current may flow from op-amp 64 with the transistor 70 conductive and conversely for a decreasing voltage V+, the current from op-amp 66 flows through the transistor 72.

If the clamping signal at the input 44 is such as to put the op-amps 64, 66 in an "off" state the output impedance is infinitely high whereas when the op-amps are in an "on" state the output impedance is low because of the feedback connection to the inverting input.

The charging and discharging time of the capacitor C (FIG. 5A) or capacitance of the delay circuit 28 can be very fast depending on the maximum output currents.

As mentioned above in the description of FIG. 5A, the input terminal 68 of the clamping circuit is connected to $V_{R3}$. When the control signal on the input 44 activates the clamping circuit 42, the output of the clamping circuit 42 together with the second, non-inverting inputs of the switches S1 to Sn are clamped at $V_{R3}+\Delta Vd$, where $\Delta Vd$ equals Vt*ln(Ae1/Ae2). The effect of V1 on V2 is overridden by the low ohmic node resistance. The voltage at the input of the comparator C3 of switch S3 (FIG. 4), with the clamping circuit activated is in any event $\Delta Vd$, which is independent of the state of the multiple switch before clamping. With the clamping voltage only, $V_{R3}$ in FIG. 5A, only the switches S1, S2 and S3 are activated each time.

In the general case, if the input terminal 68 is connected to a reference voltage $V_{Rx}$ in FIG. 5A, then the switches S1, S2 and Sx associated with that reference voltage are always switched on when the clamping voltage switches on the op-amps 64, 66.

FIG. 8 illustrates by way of example a transfer function of a stepwise switched agc voltage. The limits $V_{out2}$ and $V_{out1}$ illustrate the lower and upper limits of the control voltage range.

As the input voltage V1 increases from a low value and reaches $V_{out1}$, switch S1 is activated causing a step-like shift in the gain of the rf amplifier 12 (FIG. 3) and/or attenuation of a PIN diode attenuator, if provided. The transfer function drops substantially instantaneously by a damping factor D1 and then slowly increases as a result of V2 increasing until the switch S2 is activated to cause another step-like change in gain and/or attenuation. The transfer function decreases by a damping factor D2. Assuming V1 remains high the switches S3 to Sn are successively operated.

In the reverse direction, the switches Sn to S1 are de-activated when the waveform reaches $V_{out2}$. At each activation of a switch, the gain of the rf amplifier is increased and/or the attenuation is decreased.

The damping factors D1 to Dn may be equal or unequal. An advantage of D1 to Dn progressively increasing in value is to reduce the effect of self reception which is particularly applicable to zero IF receivers.

Figure 1:
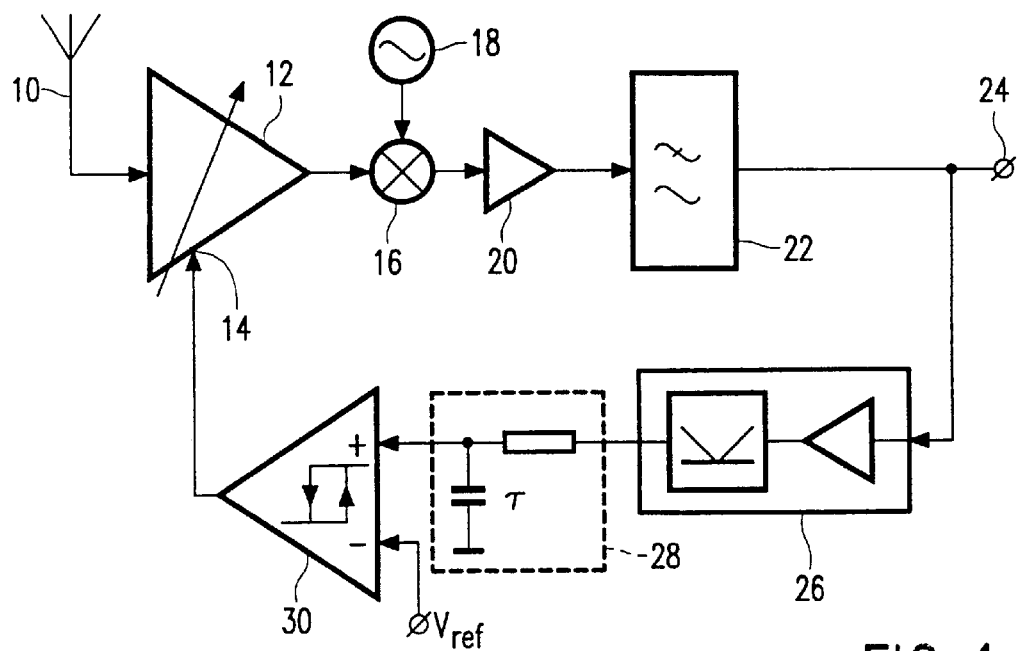
FIG. 1 is a block schematic diagram of a prior art single switched agc circuit which has been described in the preamble of this specification.
Figure 2:
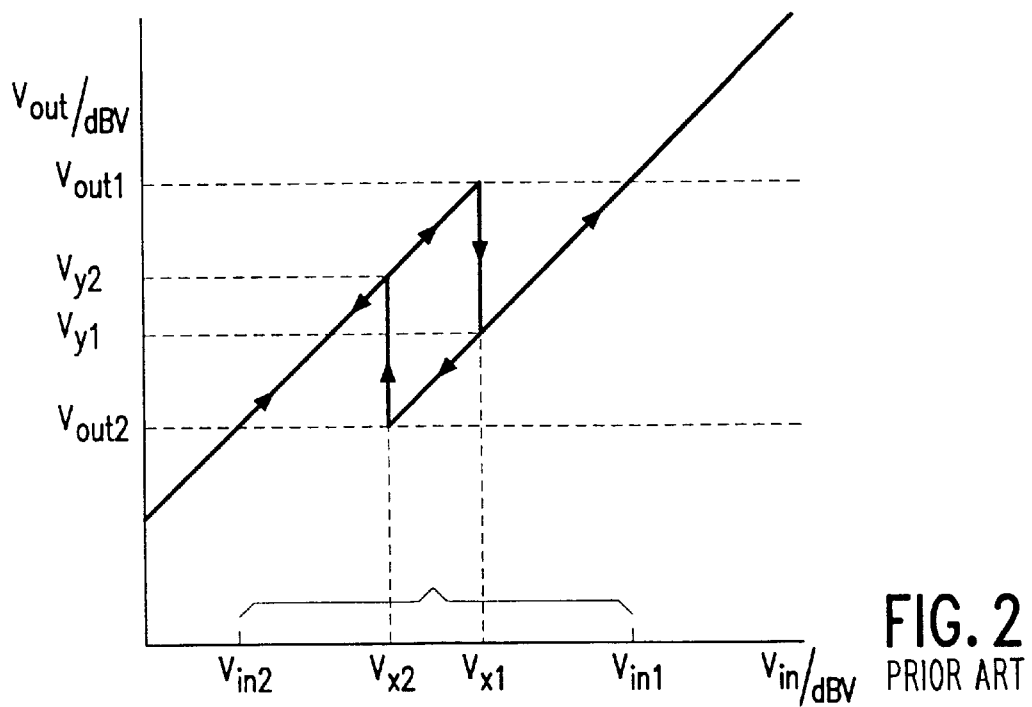
FIG. 2 illustrates the transfer function of the prior art single switched agc circuit shown in FIG. 1.
Figure 9:
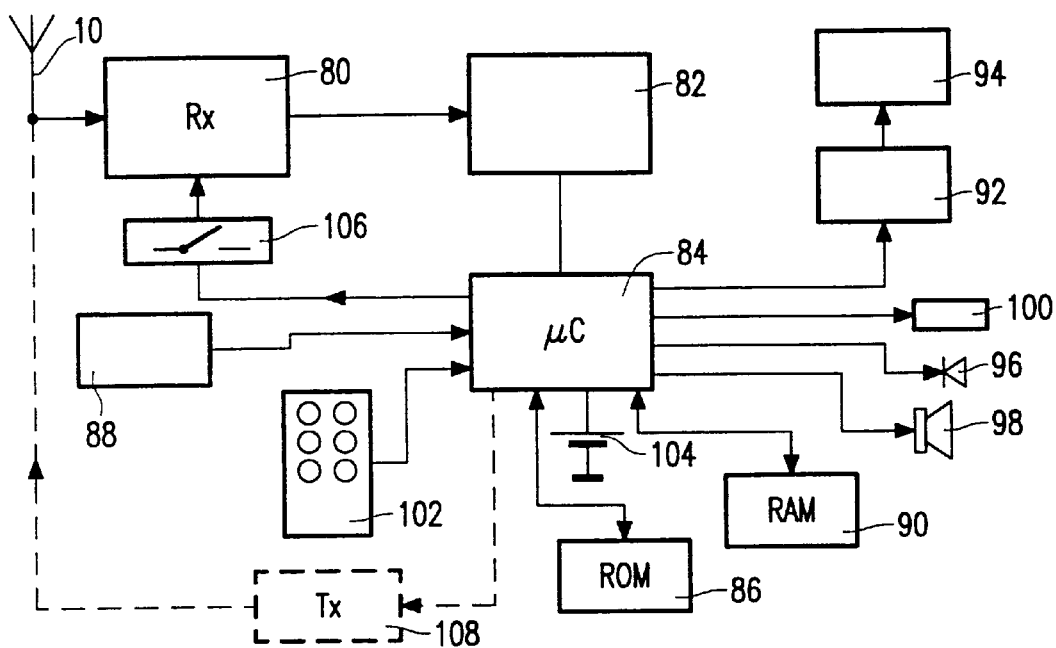
FIG. 9 is a block schematic diagram of a pager.

The pager shown in FIG. 9 comprises a receiver 80 coupled to an antenna 10. The receiver 80 may be a superheat receiver of the type shown in FIG. 1 or a zero IF receiver. An output of the receiver 80 is coupled to a decoder 82 for decoding the signals from the receiver. A microcontroller 84 is operated in accordance with a program stored in a program store 86. Also coupled to the microcontroller are an address memory 88, a RAM 90 for storing messages, a display driver 92 for displaying messages and control indications on a LCD panel 94, and alerting devices such as a light emitting diode (LED) 96, acoustic transducer 98 and a vibrator 100. A keypad 102 is coupled to the microcontroller 84 to input user instructions.

A battery 104 is coupled to the microcontroller 84 for powering the pager circuits. A power control switch 106 is coupled between an output of the microcontroller 84 and the receiver 80 whereby battery power conservation is implemented in accordance with pager protocol, such as the CCIR Radiopaging Code No.1, being applied.

If the pager is an answer back pager then it will further comprise a transmitter 108 shown in broken lines.

In the described and illustrated embodiments of the multiple switch and clamping circuits, it has been assumed that only positive transients are being damped. However these circuits can be adapted to detect and damp negative transients.

From reading the present disclosure, other modifications will be apparent to persons skilled in the art. Such modifications may involve other features which are already known in the design, manufacture and use of radio receivers and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalization thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A radio receiver comprising signal receiving means, means for adjusting the amplitude of a signal received by said signal receiving means, a signal transmission system coupled to said means for adjusting the signal amplitude, an agc feedback loop coupled between an output of the signal transmission system and a control input of the signal amplitude adjusting means, the agc feedback loop comprising means for producing a multiple switched agc signal, said means for producing the multiple switched agc signal being adapted to produce a transfer characteristic in which each time a maximum value is reached, it is reduced substantially instantaneously by a damping factor, thereafter the characteristic increases gradually to the maximum value, a further damping factor being introduced and so on, and in which each time a minimum value is reached a damping factor is introduced substantially instantaneously to increase the characteristic, thereafter the characteristic decreases gradually to the minimum value, a further damping factor being introduced and so on.

2. A receiver as claimed in claim 1, wherein the damping factors increase in value from a low input voltage to a high input voltage and decrease in value from a high input voltage to a low input voltage.

3. A receiver as claimed in claim 1, wherein the means for producing the multiple switched agc signal comprises a plurality of n switches, where n is an integer having a value of at least 2, arranged in tandem, each switch having a first input for a reference voltage signal, a second input for an input signal, a fast hysteresis output, a slow hysteresis output and a signal output, a reference voltage source coupled to each first input, n first fast hysteresis voltage controlled voltage sources (hereinafter called fast voltage sources), each of said n first fast voltage sources being coupled in series opposition with each of the n reference voltage sources, (n−1) second fast voltage sources being connected in series with the first fast voltage sources of the second to n switches, and so on with one nth fast voltage source connected in series with the first to (n−1)th fast voltage sources of the nth switch, each of said first to n fast voltage sources being controlled by the fast hysteresis output of its correspondingly numbered stage, n slow hysteresis voltage controlled voltage sources(hereinafter called slow voltage sources) connected in series between a signal input and an input to a time delay circuit, an output of the delay circuit being coupled in parallel to the second inputs of said n switches, a control input of each of the slow voltage sources being coupled to a respective one of the slow hysteresis outputs.

4. A receiver as claimed in claim 3, wherein the difference between successive pairs of reference voltages is the same and the fast and the slow voltage sources produce substantially the same voltage.

5. A receiver as claimed in claim 4, further comprising a clamping circuit having an input coupled to a first input of one of said n switches and an output coupled to the second inputs of said n switches and means for activating said clamping circuit during warming up of the receiver to fix the agc.

6. A receiver as claimed in claim 5, wherein the input of the clamping circuit is coupled to the first input of the second to nth of said n switches.

7. A receiver as claimed in claim 3, further comprising a clamping circuit having an input coupled to a first input of one of said n switches and an output coupled to the second inputs of said n switches and means for activating said clamping circuit during warming up of the receiver to fix the agc.

8. A receiver as claimed in claim 7, wherein the input of the clamping circuit is coupled to the first input of the second to nth of said n switches.

9. A receiver as claimed in claim 1, wherein the means for producing multiple switched agc signals comprises a plurality of n switches, where n is an integer having a value of at least 2, arranged in tandem, each switch having a first input for a reference current signal, a second input for an input signal, a fast hysteresis output coupled to a fast hysteresis current source, a slow hysteresis output coupled to a slow hysteresis current source and a signal output for providing an output current signal, means for converting the output current signal into a corresponding output voltage signal, a time delay circuit having an input coupled to the slow hysteresis current source and an output coupled in parallel to the second inputs of the switches.

10. A receiver as claimed in claim 9, further comprising a clamping circuit having an input coupled to a first input of one of said n switches and an output coupled to the second inputs of said n switches and means for activating said clamping circuit during warming up of the receiver to fix the agc.

11. A radio receiver comprising signal receiving means, means for adjusting the amplitude of a signal received by said signal receiving means, means for frequency down converting the signal at an output of the amplitude adjusting means, means for selecting a wanted signal from the output of the frequency down converting means and providing an output signal, an agc feedback loop coupled between an output of the wanted signal selecting means and a control input of the signal amplitude adjusting means, the agc loop comprising level detecting means and means for producing a multiple switched agc signal, said means for producing the multiple switched agc signal being adapted to produce a transfer characteristic in which each time a maximum value is reached, it is reduced substantially instantaneously by a damping factor, thereafter the characteristic increases gradually to the maximum value, a further damping factor being introduced and so on, and in which each time a minimum value is reached a damping factor is introduced substantially instantaneously to increase the characteristic, thereafter the characteristic decreases gradually to the minimum value, a further damping factor being introduced and so on.

12. A receiver as claimed in claim 11, wherein the damping factors increase in value from a low input voltage to a high input voltage and decrease in value from a high input voltage to a low input voltage.

13. A receiver as claimed in claim 11, wherein the means for producing the multiple switched agc signal comprises a plurality of n switches, where n is an integer having a value of at least 2, arranged in tandem, each switch having a first input for a reference voltage signal, a second input for an input signal, a fast hysteresis output, a slow hysteresis output and a signal output, a reference voltage source coupled to each first input, n first fast hysteresis voltage controlled voltage sources (hereinafter called fast voltage sources), each of said n first fast voltage sources being coupled in series opposition with each of the n reference voltage sources, (n−1) second fast voltage sources being connected in series with the first fast voltage sources of the second to n switches, and so on with one nth fast voltage source connected in series with the first to (n−1)th fast voltage sources of the nth switch, each of said first to n fast voltage sources being controlled by the fast hysteresis output of its correspondingly numbered stage, n slow hysteresis voltage controlled voltage sources(hereinafter called slow voltage sources) connected in series between a signal input and an input to a time delay circuit, an output of the delay circuit being coupled in parallel to the second inputs of said n switches, a control input of each of the slow voltage sources being coupled to a respective one of the slow hysteresis outputs.

14. A receiver as claimed in claim 13, wherein the difference between successive pairs of reference voltages is the same and the fast and the slow voltage sources produce substantially the same voltage.

15. A receiver as claimed in claim 14, further comprising a clamping circuit having an input coupled to a first input of one of said n switches and an output coupled to the second inputs of said n switches and means for activating said clamping circuit during warming up of the receiver to fix the agc.

16. A receiver as claimed in claim 13, further comprising a clamping circuit having an input coupled to a first input of one of said n switches and an output coupled to the second inputs of said n switches and means for activating said clamping circuit during warming up of the receiver to fix the agc.

17. A receiver as claimed in claim 16, wherein the input of the clamping circuit is coupled to the first input of the second to nth of said n switches.

18. A receiver as claimed in claim 11, wherein the means for producing multiple switched agc signals comprises a plurality of n switches, where n is an integer having a value of at least 2, arranged in tandem, each switch having a first input for a reference current signal, a second input for an input signal, a fast hysteresis output coupled to a fast hysteresis current source, a slow hysteresis output coupled to a slow hysteresis current source and a signal output for providing an output current signal, means for converting the output current signal into a corresponding output voltage signal, a time delay circuit having an input coupled to the slow hysteresis current source and an output coupled in parallel to the second inputs of the switches.

19. A receiver as claimed in claim 18, further comprising a clamping circuit having an input coupled to a first input of one of said n switches and an output coupled to the second inputs of said n switches and means for activating said clamping circuit during warming up of the receiver to fix the agc.

20. A paging receiver having a receiver stage, a decoding stage coupled to an output of the receiving stage and means for indicating the receipt of a paging message, wherein the receiving stage comprises signal receiving means, means for adjusting the amplitude of a signal received by said signal receiving means, a signal transmission system coupled to said means for adjusting the signal amplitude, an agc feedback loop coupled between an output of the signal transmission system and a control input of the signal amplitude adjusting means, the agc feedback loop comprising means for producing multiple switched agc signals, said means for producing the multiple switched agc signal being adapted to produce a transfer characteristic in which each time a maximum value is reached, it is reduced substantially instantaneously by a damping factor, thereafter the characteristic increases gradually to the maximum value, a further damping factor being introduced and so on, and in which each time a minimum value is reached a damping factor is introduced substantially instantaneously to increase the characteristic, thereafter the characteristic decreases gradually to the minimum value, a further damping factor being introduced and so on.

\* \* \* \* \*